US009229848B2

(12) United States Patent
Parthasarathy et al.

(10) Patent No.: US 9,229,848 B2
(45) Date of Patent: Jan. 5, 2016

(54) DETERMINING SOFT DATA FOR FRACTIONAL DIGIT MEMORY CELLS

(71) Applicant: Micron Technology, Inc., Boise, ID (US)

(72) Inventors: Sivagnanam Parthasarathy, Carlsbad, CA (US); Patrick R. Khayat, San Diego, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 370 days.

(21) Appl. No.: 13/746,181

(22) Filed: Jan. 21, 2013

(65) Prior Publication Data

US 2014/0208054 A1 Jul. 24, 2014

(51) Int. Cl.
G06F 12/10 (2006.01)
G06F 12/02 (2006.01)
G06F 3/06 (2006.01)
G11C 11/56 (2006.01)
G11C 16/04 (2006.01)

(52) U.S. Cl.
CPC ........ *G06F 12/02* (2013.01); *G06F 3/06* (2013.01); *G11C 11/5628* (2013.01); *G11C 11/5642* (2013.01); *G11C 16/0483* (2013.01); *G11C 2211/5641* (2013.01)

(58) Field of Classification Search
CPC .... G06F 3/0647; G06F 12/02; G11C 11/5642
USPC .......................................................... 711/165
See application file for complete search history.

(56) References Cited

U.S. PATENT DOCUMENTS

| 6,587,372 | B2 | 7/2003 | Blodgett |
| 7,071,849 | B2 | 7/2006 | Zhang |
| 7,447,066 | B2 * | 11/2008 | Conley et al. ............ 365/185.03 |
| 7,502,254 | B2 | 3/2009 | Murin et al. |
| 7,656,707 | B2 | 2/2010 | Kozlov |
| 7,814,401 | B2 | 10/2010 | Alrod et al. |
| 7,848,142 | B2 | 12/2010 | Radke |
| 8,031,529 | B2 | 10/2011 | Sarin |
| 8,059,763 | B1 | 11/2011 | Varnica et al. |

(Continued)

FOREIGN PATENT DOCUMENTS

WO 2011113034 A2 8/2012

OTHER PUBLICATIONS

Lou, et al., "Increasing Storage Capacity in Multilevel Memory Cells by Means of Communications and Signal Processing Techniques," Abstract 1 pg., Aug. 2000, vol. 147, Issue 4, Circuits, Devices and Systems, IEE Proceedings.

(Continued)

*Primary Examiner* — Jae Yu
(74) *Attorney, Agent, or Firm* — Brooks, Cameron & Huebsch, PLLC

(57) ABSTRACT

Apparatuses and methods for determining soft data for fractional digit memory cells are provided. One example apparatus can include a controller to determine states of memory cells of a group of memory cells operated as fractional digit memory cells, and determine soft data based, at least partially, on dimensions to which particular memory cells correspond with respect to the group of memory cells, determined states of the memory cells with respect to a state adjacent a state corresponding to a swapping shell, and whether a particular memory cell is a candidate for swapping.

21 Claims, 6 Drawing Sheets

(56) References Cited

U.S. PATENT DOCUMENTS

| | | |
|---|---|---|
| 8,065,583 B2 | 11/2011 | Radke |
| 8,125,826 B2 | 2/2012 | Radke |
| 8,166,379 B1 | 4/2012 | Wu et al. |
| 8,243,511 B2 | 8/2012 | Patapoutian et al. |
| 2009/0109747 A1 | 4/2009 | Radke |
| 2010/0034018 A1 | 2/2010 | Yang et al. |
| 2010/0157641 A1 | 6/2010 | Shalvi et al. |
| 2010/0220514 A1 | 9/2010 | Vigoda et al. |
| 2011/0058424 A1 | 3/2011 | Goda et al. |
| 2011/0093652 A1 | 4/2011 | Sharon et al. |
| 2011/0167305 A1 | 7/2011 | Haratsch et al. |
| 2011/0209031 A1 | 8/2011 | Kim et al. |
| 2011/0214029 A1 | 9/2011 | Steiner et al. |
| 2011/0246855 A1 | 10/2011 | Cheng et al. |
| 2011/0246859 A1 | 10/2011 | Haratsch et al. |
| 2012/0198314 A1 | 8/2012 | Yang et al. |
| 2012/0236638 A1 | 9/2012 | Weingarten et al. |
| 2012/0240007 A1 | 9/2012 | Barndt et al. |

OTHER PUBLICATIONS

U.S. Appl. No. 12/889,372, entitled "Phase Change Memory State Determination Using Threshold Edge Detection," filed Sep. 23, 2010, (29 pgs.).

U.S. Appl. No. 13/435,243, entitled "Encoding Program Bits to Decouple Adjacent Worldlines in a Memory Device," filed Mar. 30, 2012, (24 pgs.).

U.S. Appl. No. 13/474,609, entitled "Program-Disturb Management for Phase Change Memory," filed May 17, 2012, (30 pgs.).

U.S. Appl. No. 13/691,266, entitled "Determining Soft Data From a Hard Read," filed Nov. 30, 2012, (54 pgs.).

U.S. Appl. No. 13/444,314, entitled "Mapping Between Program States and Data Patterns," filed Apr. 11, 2012, (44 pgs.).

U.S. Appl. No. 13/746,195, entitled "Determining Soft Data Using a Classification Code," filed Jan. 21, 2013, (39 pgs.).

* cited by examiner

US 9,229,848 B2

DETERMINING SOFT DATA FOR FRACTIONAL DIGIT MEMORY CELLS

TECHNICAL FIELD

The present disclosure relates generally to memory error correction, and more particularly, to apparatuses and methods for determining soft data for fractional digit memory cells.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory, e.g., NAND flash memory and/or NOR flash memory, and/or can include volatile memory, e.g., DRAM and/or SRAM, among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory cells in an array architecture can be programmed to a desired state. For instance, electric charge can be placed on or removed from the charge storage structure, e.g., floating gate, of a memory cell to program the cell to a particular state. For example, a single level (memory) cell (SLC) can be programmed to one of two different states, each representing a different digit of a data value, e.g., a 1 or 0. Some flash memory cells can be programmed to one of more than two states corresponding to different particular data values, e.g., 1111, 0111, 0011, 1011, 1001, 0001, 0101, 1101, 1100, 0100, 0000, 1000, 1010, 0010, 0110, or 1110. Such cells may be referred to as multi state memory cells, multiunit cells, or multilevel (memory) cells (MLCs). MLCs can provide higher density memories without increasing the number of memory cells since each cell can be programmed to states corresponding to more than one digit, e.g., more than one bit of data.

Various error correction code (ECC) schemes can perform better via use of soft data. However, determining soft data and/or communicating soft data, e.g., between controller and memory, can be time consuming, and therefore can impact memory throughput. A hard read is an operation to determine hard data, e.g., a data value stored in a memory cell based on its state. Soft data, for example, can be used to indicate a confidence level associated with the hard data. For instance, soft data can provide a confidence, e.g., reliability, measure associated with a hard read, e.g., a likelihood that a determined state of a memory cell is a different state.

Some memory cells can be programmed to a quantity of states that does not correspond to an integer number of stored digits, e.g., bits. As used herein, "stored in" a memory cell intends the memory cell being programmed to a state corresponding a data value or portion thereof. For instance, each memory cell can correspond to a fractional number of stored bits. Multiple memory cells can be used together to store an integer number of bits. Memory cells used together to store an integer number of bits are referred to herein as fractional bit memory cells. As such, a fractional bit memory cell is physically the same as a memory cell used to store an integer number of bits. A fractional bit memory cell is a memory cell that can be used in conjunction with other memory cells to store an integer number of bits as a group of memory cells. Various packing schemes can be used to map between states of the multiple memory cells and particular data values.

DETAILED DESCRIPTION

Figure 1:
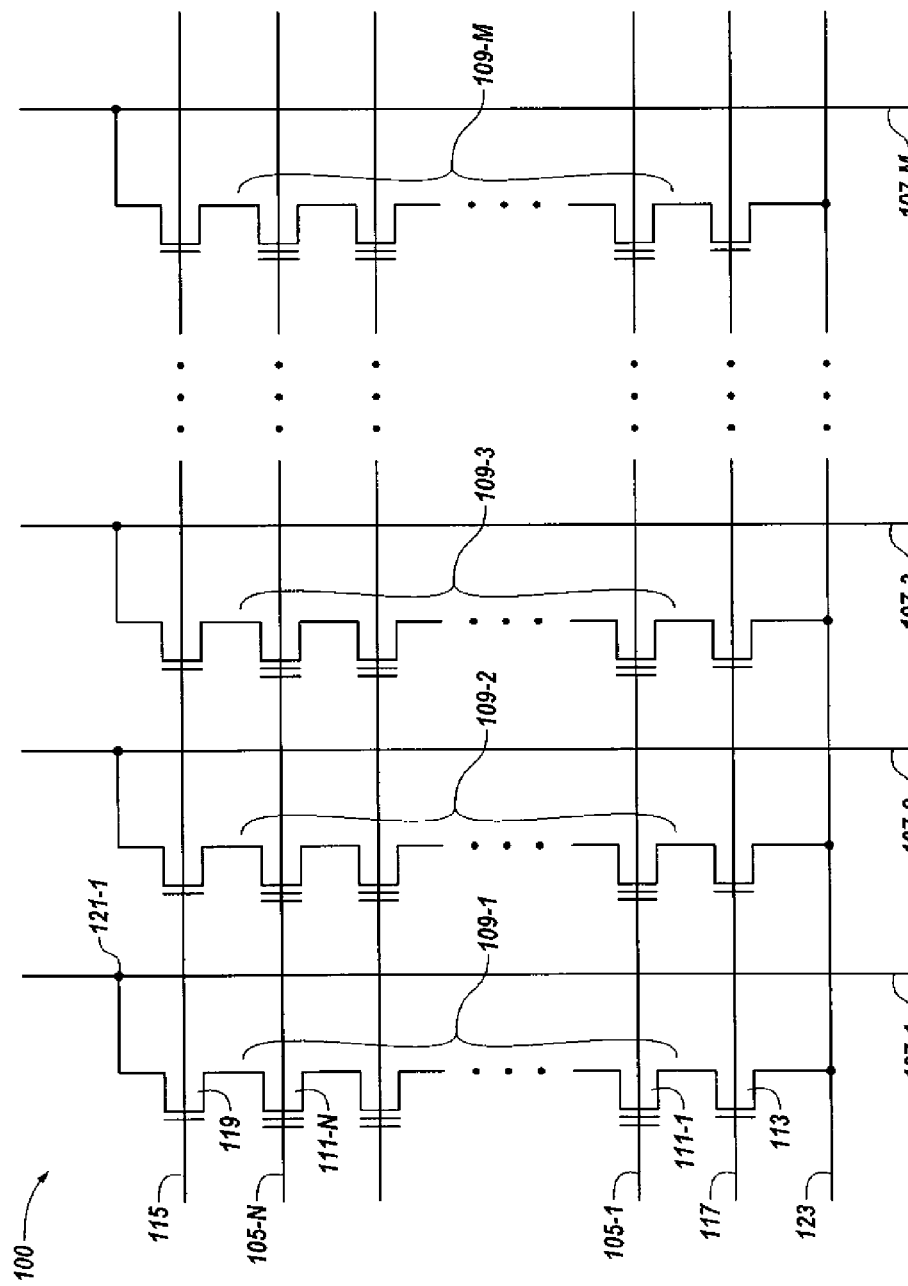
FIG. 1 illustrates a schematic diagram of a portion of a non-volatile memory array in accordance with a number of embodiments of the present disclosure.

The present disclosure provides apparatuses and methods for determining soft data for fractional digit memory cells. One example apparatus can include a controller to determine states of memory cells of a group of memory cells operated as fractional digit memory cells, and determine soft data based, at least partially, on dimensions to which particular memory cells correspond with respect to the group of memory cells, determined states of the memory cells with respect to a state adjacent a state corresponding to a swapping shell, and whether a particular memory cell is a candidate for swapping.

One way of increasing the capacity of memory devices is to store more than one bit of data per memory cell. If a memory cell can store multiple bits of data per memory cell, the capacity of the memory cell is likewise multiplied. It is possible to store more than one bit of data per memory cell in certain types of memory, such as Flash memory. Storing multiple bits of data per memory cell can also reduce the per unit storage capacity cost of a memory. However, storing multiple bits of data per memory cell does involve additional complexity.

For memory cells based on charge storage, such as Flash memory cells, the operative threshold voltage range of a memory cell can be the same for single level (memory) cell (SLC) or multiple level (memory) cell (MLC) devices. Therefore, increasing the number of states per cell increases the effect of noise on distinguishing between particular states. As a result, more complex error correction codes (ECC) schemes may be used to deal with higher raw bit error rates (RBERs) that can be associated with an increased number of states per memory cell. As an example, ECC schemes, such as those involving low-density parity-check (LDPC) codes, can provide significantly stronger error-correction capability over Bose Chaudhuri Hochquenghem (BCH) codes. Such advanced ECC schemes can work more effectively with use of soft data, e.g., soft information.

Soft data can be generated by making multiple reads of memory cells. Soft data can be beneficial in correcting errors, e.g., by ECC schemes, to detect that some of a group of digits are more likely to be in error and/or specifically identify particular digits that are more likely to be in error.

When multiple fractional digit, e.g., bit, memory cells are used to store data values comprising an integer number of bits, the number of possible valid mappings for fractional bit memory cell schemes that involve multiple dimensions grows exponentially and creates a challenge to enumerate. "Dimensions," as used herein, refer to the quantity of fractional bit memory cells used to store an integer number of bits of a data value. For instance, a four dimensional example includes four 2.25 bit/memory cells storing a nine bit data value across the four cells with 5 levels/states. According to some embodiments of the present disclosure, an approach to generating soft data, e.g., log-likelihood ratios (LLRs) that can avoid enumerating all the possible mappings can be well suited for physical implementation with respect to memory utilizing fractional bit memory cell configurations and/or applied to other multiple dimensional polynomial based packing schemes.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first bit or bits correspond to the drawing figure number and the remaining bits identify an element or component in the drawing. Similar elements or components between different figures may be identified by the use of similar bits. For example, 100 may reference element "00" in FIG. 1, and a similar element may be referenced as 600 in FIG. 6. Elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array, e.g., NAND Flash. However, embodiments described herein are not limited to this example. As shown in FIG. 1, memory array 100 includes access lines, e.g., word lines 105-1, . . . , 105-N, and intersecting data lines, e.g., local bit lines, 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET), 113, and a drain select gate (SGD), e.g., FET, 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of non-volatile memory cells 111-1, . . . , 111-N includes a source, a drain, a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

Subsets of cells coupled to a selected word line, e.g., 105-1, ..., 105-N, can be programmed and/or read together as a page of memory cells. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, state, e.g., charge storage state. State is equivalently referred to as "level" herein.

A read operation, which can also refer to a program verify operation, can include sensing a voltage and/or current change of a bit line coupled to a selected cell in order to determine the state of the selected cell. The states of a particular fractional bit memory cell may not correspond directly to a data value of the particular memory cell, rather the states of a group of memory cells including the particular memory cell together map to a data value having an integer number of bits. The read operation can include pre-charging a bit line and detecting the discharge when a selected cell begins to conduct.

Determining, e.g., detecting, the state of a selected cell can include providing a number of sensing signals, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be detected to determine whether or not the selected cell conducts in response to the particular sensing signal applied to the selected word line. For example, the state of a selected cell can be determined by the word line voltage at which the bit line current reaches a particular reference current associated with a particular state.

MLCs can be two-bit, e.g., four-state, memory cells, or store more than two bits of data per memory cell, including fractional bits of data per memory cell. For example, a two-bit memory cell can be programmed to one of four states, e.g., P0, P1, P2, and P3, respectively. In operation, a number of memory cells, such as in a selected block, can be programmed such that they have a Vt level corresponding to either P0, P1, P2, or P3. As an example, state P0 can represent a stored data value such as binary "11". State P1 can represent a stored data value such as binary "10". State P2 can represent a stored data value such as binary "00". State P3 can represent a stored data value such as binary "01". However, embodiments are not limited to these data value correspondence.

Figure 2:
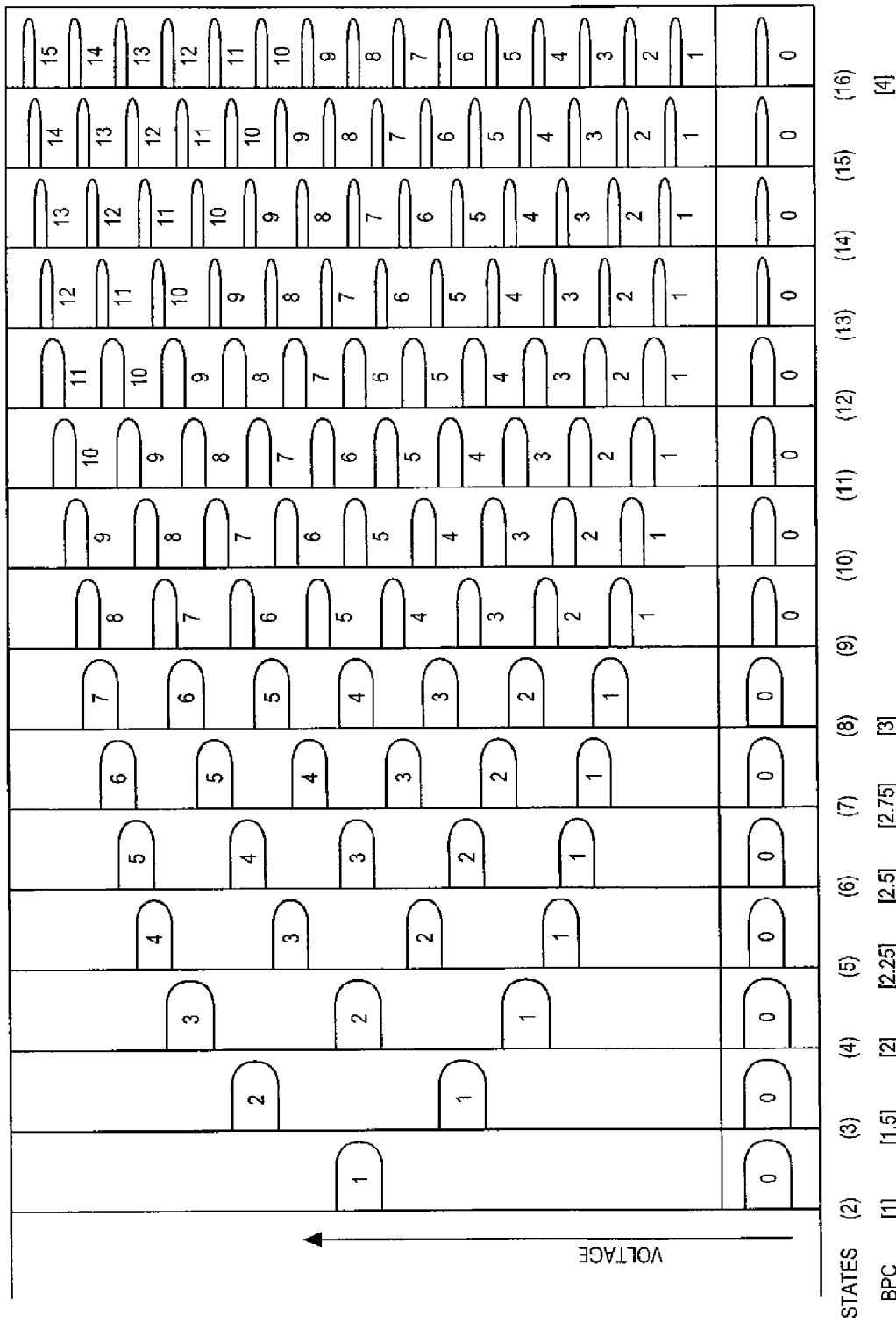
FIG. 2 is a diagram illustrating examples of different numbers of states to which memory cells can be programmed in accordance with a number of embodiments of the present disclosure.

FIG. 2 is a diagram illustrating examples of different numbers of states to which a memory cell can be programmed in accordance with a number of embodiments of the present disclosure. The memory cells can be NAND flash memory cells as described above and can be programmed to various Vt levels, e.g., within a voltage range of about −2V to +3V. However, embodiments of the present disclosure are not limited to a particular type of memory cell or to a particular operational voltage range. One can observe from FIG. 2 that as the quantity of states per memory cell increases, the voltage range comprising a particular state decreases, and/or the separation between states decreases. Therefore, it can be more difficult to accurately distinguish between adjacent states as the quantity of states per memory cell increases.

The quantity of states (STATES) to which a memory cell may be programmed is indicated below the diagram, and the quantity of bits stored per memory cell (BPC) is shown for certain quantities of states. The states shown in FIG. 2 are labeled 0, 1, 2, 3, 4, etc., with each state corresponding to a respective distribution of Vt levels within the operative threshold voltage range. The lowermost state, e.g., a state corresponding to lowermost Vt levels, may be referred to as an erase state. The states to which a memory cell may be programmed can also be referred to as program states herein.

The number of bits of data that can be stored by a memory cell can be determined using the formula $\log_2(L)$, where L is the number of states to which the memory cell is programmable. Memory cells programmable to a power of 2 quantity of states, e.g., 2 states, 4 states, 8 states, etc., can individually store an integer number, N, of bits of data per memory cell.

For MLC memory devices, the majority of read errors are single state errors, e.g., single level errors. A single state error occurs when the detected state of a memory cell is a state adjacent to the state to which the memory cell was programmed. As such, single state errors can cause errors among the bits of data represented by the state. Where the data value arrangement utilizes Gray coding, a single state error corresponds to a single bit error. A majority of data value errors can be identified and/or corrected by considering the currently-detected state, e.g., current state, as well as adjacent states, e.g., states neighboring the detected state. Considering only the current and adjacent states, rather than all possible states for example, with respect to ECC and/or soft data computations can provide good results in an efficient manner.

For example, a memory cell that can be programmed to one of two different states, e.g., 0 or 1, can store one bit of data, e.g., 0 or 1. A memory cell that can be programmed to one of four different states, e.g., 0, 1, 2, or 3, can store two bits of data, e.g., 00, 01, 10, or 11. A memory cell that can be programmed to one of eight different states, e.g., 0-7, can store three bits of data, e.g., 000, 001, 010, 011, 100, 101, 110, or 111.

Memory cells that are programmable to a non-power-of-2 quantity of states, e.g., 3 states, 5 states, etc., can store a non-integer number of bits of data per memory cell, e.g., fractional number of bits of data per memory cell. Memory cells that are programmable to a non-power-of-2 quantity of states can be used in combination with other memory cell(s) to store an integer number of bits of data. That is, rather than each individual cell storing an integer number of bits of data (N) per memory cell, combinations of the memory cells store an integer number (N) of bits of data.

For instance, two memory cells that can each be programmed to one of three different states, e.g., 0, 1, or 2, can be said to store 1½ bits of data per memory cell, and can, in combination, store three bits of data, e.g., 000, 001, 010, 011, 100, 101, 110, or 111. A memory cell that can be programmed to one of five different states, e.g., 0 to 4, can be combined with three other such memory cells to store 9 bits of data, e.g., 000000000, 000000001, 000000010, etc. In general, for a group of cells collectively storing an integer number (N) of bits of data, but individually storing a fractional number of bits of data, $2^N$ different N bit data values are mapped to a corresponding number, e.g., $2^N$, of different state combinations of the group. The number of possible state combinations for the group can be (number of levels/memory cell)$^{(number\ of\ memory\ cells/group)}$, for example. Determining soft data from a hard read can be implemented involving memory cells having capability to store whole and/or fractional bits of data per memory cell. Memory cells that are programmable to a non-power-of-2 quantity of states are discussed further below with respect to FIG. 3C.

Figure 3A:
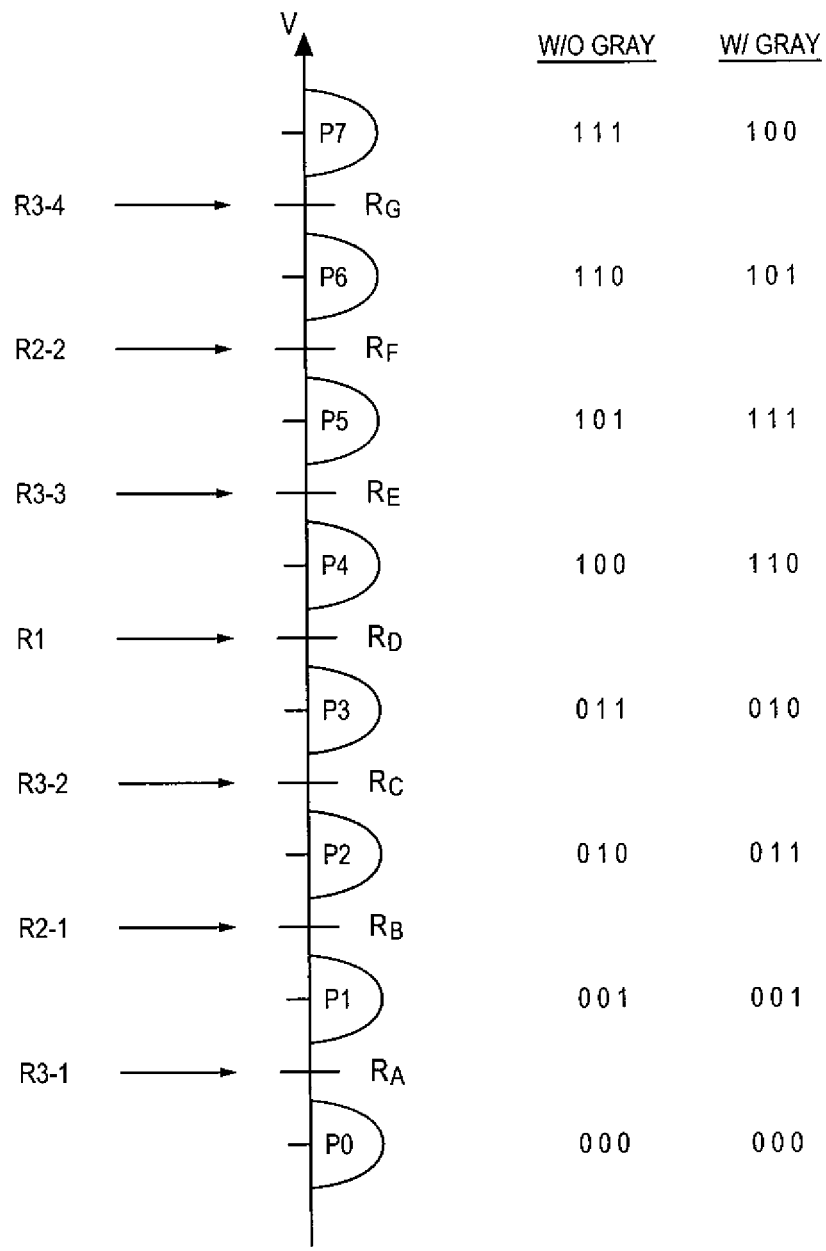
FIG. 3A illustrates a diagram of states and sensing magnitudes for a multilevel memory cell in accordance with a number of embodiments of the present disclosure.

FIG. 3A illustrates a diagram of states and sensing magnitudes for a multilevel memory cell in accordance with a number of embodiments of the present disclosure. The example shown in FIG. 3A can represent, for example, memory cells 111-1, . . . , 111-N previously described in connection with FIG. 1. A hard read is an operation to determine hard data by comparing the threshold voltage of a memory cell, e.g., flash memory cell, to reference voltages delineating ranges of voltages corresponding to particular states. FIG. 3A shows eight states, e.g., P0, P1, P2, P3, P4, P5, P6, and P7 for a 3 bits/cell MLC. A 3 bits/cell MLC can be programmed to one of the states. Read sensing signals can be used to detect a state of the memory cell.

Figure 3B:
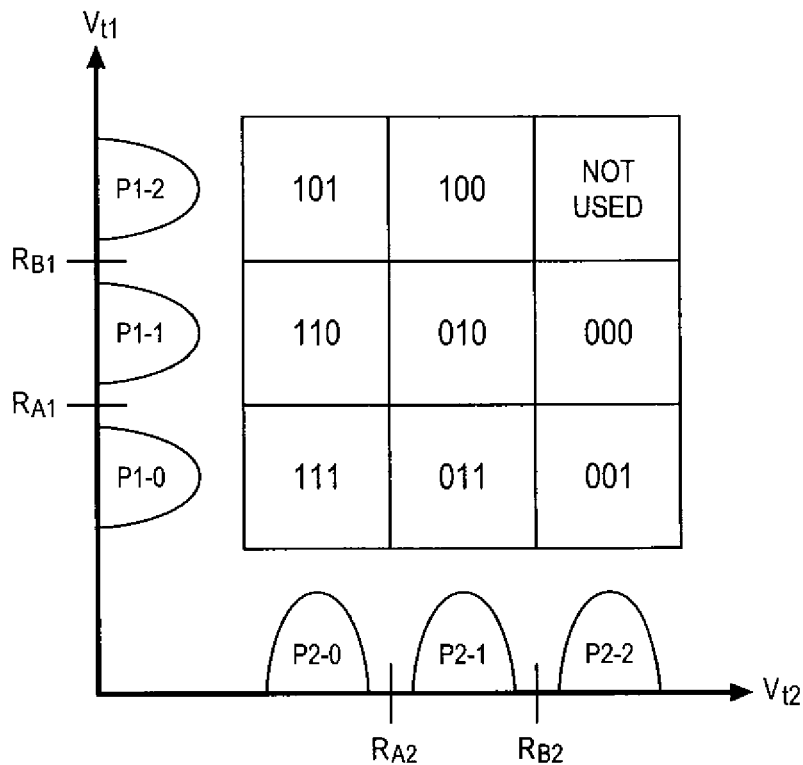
FIG. 3B a diagram of a number of states and data values corresponding to fractional bits per memory cell configurations in accordance with a number of embodiments of the present disclosure.

FIG. 3B illustrates a diagram of a number of states and data values corresponding to fractional bits of data per memory cell configurations in accordance with a number of embodiments of the present disclosure. The example shown in FIG. 3B can represent, for example, memory cells 111-1, . . . , 111-N previously described in connection with FIG. 1. The example shown in FIG. 3B represents two 1½ bit, e.g., three-state, memory cells. That is, two memory cells are used in combination to store 3 bits of data. As such 3 bits divided by 2 memory cells equates to 1½ bits/cell. To achieve storage of 3 bits of data, eight unique combinations of states between the two memory cells are needed since there are eight possible combinations of 3 bit data values.

Therefore, each memory cell can be programmed to one of three possible states for a total of 9 possible combinations between the two memory cells. However, in at least some embodiments, only 8 of the 9 possible combinations of states between the two memory cells are used. One example association between state combinations and data values for 3 bits is shown in FIG. 3B. However, embodiments of the present disclosure are not limited to fractional bits of data per memory cell configurations illustrated by this example of 1½ bit memory cells, and can include various other fractional bit memory cells, e.g., 2¼ bit/cell, 3⅛ bit/cell, etc. Also, embodiments of the present disclosure are not limited to the particular correspondence between state combinations and associated data values shown in FIG. 3B, and other associations therebetween are possible.

In the example illustrated in FIG. 3B, the three states P1-0, P1-1, and P1-2, to which a first of the two 1½ bit memory cells can be programmed are shown on the vertical axis, e.g., y-axis, and the three states P2-0, P2-1, and P2-2 to which a second of the two 1½ bit memory cells can be programmed are shown on the horizontal, e.g., x-axis. A number of (hard) read voltages are shown for each memory cell, e.g., $R_{A1}$ and $R_{B1}$ for the first memory cell, and $R_{A2}$ and $R_{B2}$ for the second memory cell. A particular combination of states and corresponding data value can be determined by at most two hard reads per cell. It is possible in some instances to determine a particular state of a memory cell by the first hard read.

A particular data value can be determined by detecting the states for each of the two memory cells. For example, the combination of the second state for the first memory cell, e.g., P1-1, and the second state for the second memory cell, e.g., P2-1, can correspond to the data value 010 output responsive to a read request. However, if the detected state of one or both of the memory cells is different than the state to which each respective memory cell was programmed, the different detected state(s) will correspond to a different data value. The detected state of one or both of the memory cells might be a state adjacent to the state to which each respective memory cell was programmed. For example, if the first state, e.g., P1-0, is detected for the first memory cell instead of the second state (to which the first memory cell was programmed), and the third state, e.g., P2-2, is detected for the second memory cell instead of the second state (to which the second memory cell was programmed), the data value determined from the read will correspond to 001 instead of the correct data value of 010. For this reason, ECC schemes, intended to detect and correct these types of errors, can benefit from soft data that can be used in evaluating the likelihood of the detected states read being in error.

Given the benefit of maximizing the storage capacity of Flash memory, it can be beneficial to store a fractional number of bits per cell. The particular mappings between data values and state combinations corresponding to groups of fractional bit memory cells may involve less than all possible state combinations, such as that shown in FIG. 3B, and may, or may not, be implemented using gray coding. That is, the manner in which program state combinations are assigned to the data values may not be uniform. Mapping between program state combinations and data values can be based, for example, on a polynomial expression of order G, where G is the number of fractional bit cells combined to store an integer number of bits of a data values; the number of fractional bit cells combined to store an integer number of bits of a data value corresponding to the number of dimensions.

A first term of the polynomial expression can correspond to a first mapping shell and a second term of the polynomial expression can correspond to a swapping shell, e.g., second mapping shell, with each mapping shell corresponding to a number of constellation points. As an example, the polynomial expression on which the mapping is based can be the expression $(A+B)^G$, with $A^G$ being the first term and corresponding to a quantity of constellation points of the first mapping shell, and $G \times A^{(G-1)} \times B$ being the second term and corresponding to a quantity of constellation points of the second mapping shell. The term "A" can be the quantity of program states from which the respective program state combinations corresponding to the first mapping shell are determined and the term "B" can be the quantity of additional program states, e.g., an additional quantity of the L program states, from which the respective program state combinations corresponding to the second mapping shell are determined. As such, in embodiments in which two mapping shells are used, A+B is equal to the quantity of program states to which the memory cells are programmable.

As an example, A can be equal to $2^a$ with "a" being a value such that $2^a$ is an uppermost power of 2 value that is less than the quantity of program states, e.g., L, to which the memory cells are programmable. For instance, for memory cells programmable to 6 different program states and storing 2.5 bits/cell, A is equal to 4 since $2^2$ is the closest power of 2 value that is less than 6. Since A is equal to 4, B is equal to 2 (e.g., 6−4). As such, the quantity of program states from which the respective program state combinations corresponding to the first mapping shell are determined is four. That is, only combinations of the first four program states, e.g., L0 to L3, of the six program states, e.g., L0 to L5, to which the memory cells are programmable, correspond to constellation points of the first mapping shell. In this example, the quantity of additional program states from which the respective program state combinations corresponding to the second mapping shell is two, e.g., B=2. As such, only combinations comprising at least one of the last two program states, e.g., L4 and L5, of the six program states, e.g., L0 to L5, to which the memory cells are programmable, correspond to constellation points of the second mapping shell. The A program states corresponding to the first mapping shell comprise the lowermost A program states of the L program states, e.g., the program states corresponding to the lowermost Vt levels, and the B program states corresponding to the second mapping shell comprise program states other than the lowermost A program states. Such packing methods can be implemented via a data packing component such as data packer/unpacker 512 shown in, and discussed with respect to, FIG. 5 below.

As described above, a polynomial based mapping, e.g., packing, technique can be employed to translate the incoming bits in a data value to the corresponding states. An integer 'n' number of memory cells store fractional bits per memory cell (fbpc) such that n*fbpc is an integer. The packing and/or unpacking algorithm can operate on a unit of 'n' memory cells, each memory cell storing fbpc. The following Table 1 shows examples of the number of memory cells, e.g., dimensions, used in the mapping, and the total number of bits over those memory cells to represent the specified fractional bits per memory cell:

TABLE 1

Cell Grouping

| fbpc | 'n' Group of Cells | n*fbpc |
|---|---|---|
| 2 | 1 | 2 |
| 2.25 | 4 | 9 |
| 2.5 | 2 | 5 |
| 3 | 1 | 3 |
| 3.125 | 8 | 25 |
| 3.25 | 4 | 13 |
| 3.5 | 2 | 7 |

The details for an example 2.25 bits per memory cell (bpc) packing configuration are given in Table 2 below:

TABLE 2

2.25 bpc Packing

| fbpc | nLevels | No. of Cells | Reqd. Pts | States in Shell I | Points in Shell I | States in Shell II | Points in Shell II | Total Points in Shell I, II | Packing Density |
|---|---|---|---|---|---|---|---|---|---|
| 2.25 | 5 | 4 | 512 | 4 | 256 | 1 | 256 | 512 | 81.92% |

The symbol size, e.g., the number of digits per group, in a 2.25 bpc configuration is 9 bits (4*2.25) and is denoted as sym[8:0], referring to the symbol having nine bits 0-8. For example, the 9-bit data value might be 0 0 1 0 0 1 1 1 0 (first example data value) or 1 0 1 0 0 1 1 1 0 (second example data value), among others. The 4 memory cells used to program states corresponding to the 9 bits are denoted as cells[3:0], and each of the memory cells can be programmed to one of 5 states, e.g., states 0-4. Nine (9) bits can represent 2=512 possible data values, of which 256 data values have a most significant bit of 0 (corresponding to shell I), such as is shown by the first example data value above, and 256 data values have a most significant bit of 1 (corresponding to shell II), such as is shown by the second example data value above. An example shell mapping technique can use the polynomial $(a+b)^4$ where a=4, b=1. In this example, the first two terms of this expression are used, namely $a^4$ & $4a^3b$.

The first case (Case I) is for data values that have a most significant bit of 0 (the data values corresponding to shell I), e.g., sym[8]=0 (<256 case). For Case I, the most significant bit is always 0, and for the other 8 bits the following assignment shown in Table 3 can be made to the memory cells after optional gray coding of adjacent memory cells (as shown in Table 5 below). Case I describes the first term $a^4$. The four (of the five) states of each memory cell can correspond to the four possible bit combinations of 2 bits of data. That is, four states, 0 to 3, of a memory cell can be used to represent 2 bits, and so 4 memory cells storing 2 bits/cell can store 8 of the 9 bits of the 9-bit data value, and the most significant bit is always zero (b[8]=0) for Case I. None of the memory cells are programmed to the highest state, e.g., 4, as the two bits/cell can be stored using the four states 0-3.

TABLE 3

2.25 Cell Assignment

| | sym[7:0] | | | |
|---|---|---|---|---|
| | [7:6] | [5:4] | [3:2] | [1:0] |
| cells | 3 | 2 | 1 | 0 |

Table 3 indicates that bits 0 and 1 of the 9-bit data value are stored in the memory cell corresponding to dimension 0, bits 2 and 3 of the 9-bit data value are stored in the memory cell corresponding to dimension 1, bits 4 and 5 of the 9-bit data value are stored in the memory cell corresponding to dimension 2, and bits 6 and 7 of the 9-bit data value are stored in the memory cell corresponding to dimension 3. For example with respect to the first example data value given above, 0 0 1 0 0 1 1 1 0, and using the gray coding and state mapping shown in Table 5, the memory cells of each dimension are programmed to the following states:

| Memory Cell (Dimension) | 2-Bit Data Value | State |
|---|---|---|
| $D_3$ | 0 1 | 2 |
| $D_2$ | 0 0 | 3 |
| $D_1$ | 1 1 | 1 |
| $D_0$ | 1 0 | 0 |

The highest state, state 4, does not corresponds to any of the four possible 2-bit data values. Therefore, no memory cell of the group of four memory cells is programmed to a highest state.

The reverse of the above Case I mapping technique can be used when reading the group of four memory cells. Ignoring possible errors in the detected states, and assuming that the detected state is the same as the programmed state, since none of the memory cells of the group of four memory cells is detected having the highest state, e.g., 4, it can be determined that Case I applies. Therefore, the $9^{th}$ bit is zero (b[8]=0) for Case I, and the other eight bits can be determined using Table 5 to correspond the detected state to 2-bit data values for each of the four memory cells of the group of memory cells, for a total of 8 bits (with the $9^{th}$ bit being 0).

The second case (Case II) is for data values that have a most significant bit of 1 (the data values corresponding to shell II), e.g., b[8]=1 (=>256 case). For Case II, the most significant bit is always 1, and for the other 8 bits the following assignment shown in Table 4 can be made to the memory cells (and optional gray coding of adjacent memory cells as shown in Table 5 below). Note that according to Table 4, one of the four dimensions stores the highest state 4, and only one of the four dimensions stores the highest state 4. That is, programming one of the memory cells of the group of memory cells to a highest state, e.g., state 4, indicates a Case II mapping technique, which in turn indicates that the most significant bit of the 9-bit data value is 1.

Table 4 shows that the memory cell programmed to the highest state can be determined based on the values of bits 6 and 7. If bits 6 and 7 correspond to state 0, e.g., a 2-bit data value of 1 0 according to Table 5, then the memory cell corresponding to dimension 0 is programmed to the highest state, e.g., state 4, and the memory cell corresponding to the highest dimension, e.g., dimension 3, is programmed to the state corresponding to the 2-bit data value of bits 0 and 1 (that would be programmed in the memory cell corresponding to state 0 in Case I). If bits 6 and 7 correspond to state 1, e.g., a 2-bit data value of 1 1 according to Table 5, then the memory cell corresponding to dimension 1 is programmed to the highest state, e.g., state 4, and the memory cell corresponding to the highest dimension, dimension 3, is programmed to the state corresponding to the 2-bit data value of bits 2 and 3 (that would be programmed in the memory cell corresponding to dimension/memory cell 1 in Case I). If bits 6 and 7 correspond to state 2, e.g., a 2-bit data value of 0 1 according to Table 5, then the memory cell corresponding to dimension 2 is programmed to the highest state, e.g., state 4, and the memory cell corresponding to the highest dimension, dimension 3, is programmed to the state corresponding to the 2-bit data value of bits 4 and 5 (that would be programmed in the memory cell corresponding to dimension/memory cell 2 in Case I). If bits 6 and 7 correspond to state 3, e.g., a 2-bit data value of 0 0 according to Table 5, then the memory cell corresponding to dimension 3 is programmed to the highest state, e.g., state 4. It can be observed that when one of the memory cells corresponding to dimensions 0-2 are programmed to the highest state, e.g., state 4, the state corresponding to the 2-bit data value to which that memory cell would be programmed per the Case I mapping, is swapped with the memory cell of the highest dimension, dimension 3. In other words, the memory cell corresponding to the highest dimension, e.g., dimension 3, is programmed with the 2-bit data value to which that memory cell storing the highest state, e.g., state 4, would be programmed per the Case I mapping technique. Table 4 shows that the memory cell corresponding to dimension 3 can store the 2 bits which were intended to be stored in the memory cell storing the highest state, e.g., state 4. In this manner, two dimensions, including the highest dimension, e.g., dimension 3, are swapped.

TABLE 4

2.25 Systematic Assignment (Cells/Dimension)

| sym[7:6] | | Cells | | |
|---|---|---|---|---|
| | 3 | 2 | 1 | 0 |
| Dimension 0 | sym[1:0] | sym[5:4] | sym[3:2] | 4 |
| 1 | sym[3:2] | sym[5:4] | 4 | sym[1:0] |
| 2 | sym[5:4] | 4 | sym[3:2] | sym[1:0] |
| 3 | 4 | sym[5:4] | sym[3:2] | sym[1:0] |

Included below in Table 5 is an example of the bits to state mapping for 2.25 bpc.

TABLE 5

2.25 Bits-To-State Mapping

| State | 0 | 1 | 2 | 3 | 4 |
|---|---|---|---|---|---|
| Bits | 'b10 | 'b11 | 'b01 | 'b00 | $2^{nd}$ Shell |

The reverse of the above Case II mapping technique can be used when reading the group of four memory cells. Ignoring possible errors in the detected states, and assuming that the detected state is the same as the programmed state, since one of the memory cells of the group of four memory cells is detected having the highest state, e.g., 4, it can be determined that Case II applies. Therefore, the $9^{th}$ bit is one (b[8]=1) for Case II, and the other eight bits can be determined using Tables 4 and 5. The particular memory cell that is programmed to the highest state indicates (per Table 4) the state corresponding to the 2-bit data value for bits 6 and 7 of the 9-bit data value being determined. For example, detecting a highest state, e.g., state 4, in the memory cell corresponding to dimension 1 indicates Case 2 mapping, that the $9^{th}$ bit (most significant bit) is 1, that the $6^{th}$ and $7^{th}$ bits of the 9-bit data value being determined correspond to state 1, and therefore b[7:6]=11. Furthermore, detecting the highest state, e.g., state 4, in the memory cell corresponding to dimension 1 also indicates that the state detected in the memory cell corresponding to dimension 0 corresponds to the bits 0 and 1 of the 9-bit data value being determined (just like Case I), that the state detected in the memory cell corresponding to dimension 2 corresponds to the bits 4 and 5 of the 9-bit data value being determined (just like Case I), and that the state detected in the memory cell corresponding to dimension 3 corresponds to the bits 2 and 3 of the 9-bit data value being determined (which would have been stored in the memory cell corresponding to dimension 1 according to Class I mapping, but in which the highest state is stored in the Class II mapping).

The least significant eight bits of the 9-bit data value being determined can be similarly determined using Tables 4 and 5 where the highest state, e.g., state 4, is stored in the memory cell corresponding to dimensions 0 or 2. The highest state, e.g., state 4, being detected in the memory cell corresponding to dimension 3 indicates Case 2 mapping, that the $9^{th}$ bit (most significant bit) is 1, that the $6^{th}$ and $7^{th}$ bits of the 9-bit data value being determined correspond to state 3 (per Table 4), and therefore b[7:6]=00 (per Table 5). Furthermore, detecting the highest state, e.g., state 4, in the memory cell corresponding to dimension 3 also indicates that the state detected in the memory cell corresponding to dimension 0 corresponds to the bits 0 and 1 of the 9-bit data value being determined (just like Case I), that the state detected in the memory cell corresponding to dimension 1 corresponds to the bits 2 and 3 of the 9-bit data value being determined (just like Case I), and that the state detected in the memory cell corresponding to dimension 2 corresponds to the bits 4 and 5 of the 9-bit data value being determined (just like Case I). No swapping occurs where the highest state, e.g., state 4, is detected in the memory cell corresponding to dimension 3 since the state corresponding to bits 6 and 7 of the 9-bit data value being determined are indicated (per Table 4) from the memory cell corresponding to dimension 3 storing the highest state.

While one example of a packing and mapping technique is described above, the methods of the present disclosure can be implemented based on other packing and mapping techniques. While possible errors in the detected states are ignored in the discussing above, possible errors in detecting the states are discussed below, after a brief discussion regarding how soft data, e.g., log-likelihood ratios (LLRs), can be determined based on a detected state and adjacent states, e.g., neighboring states to the detected state.

Figure 4:
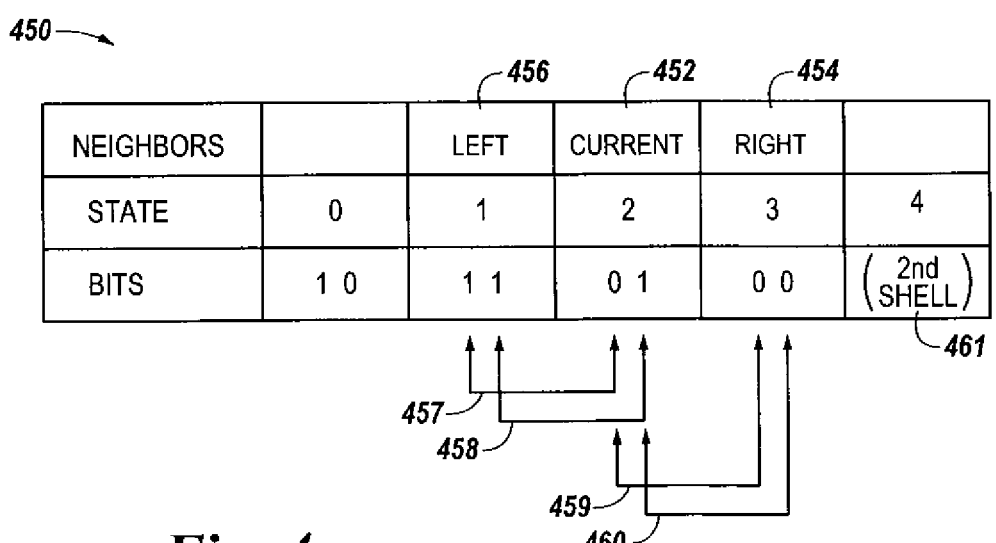
FIG. 4 illustrates a table of a gray-coded data value arrangement for a memory cell capable of storing 2.25 bits of data per memory cell in accordance with a number of embodiments of the present disclosure.

FIG. 4 illustrates a table of a gray-coded data value arrangement 450 for a memory cell capable of storing 2.25 bits of data per memory cell in accordance with a number of embodiments of the present disclosure. A change in the threshold voltage to which a memory cell was programmed can result in a different state being detected, and a different data value than was originally programmed in the memory cell being detected. However, errors in a detected state may not cause errors in all bits of the data value, e.g., particularly when gray coding is used. That is, if the data values of the adjacent states, e.g., a right state 454 and a left state 456, are considered with respect to the data value of the current read state 452, e.g., the state detected in the memory cell being read, it can be observed that errors in some bits of data values are more likely, and some are less likely. More particularly, if the bits at each position in data values of the adjacent states are considered with respect to the bit at each position in the data value of the current read state 452, it can be observed that errors in some bits of the data value of the current read state 452 are more likely, and some are less likely. From this, soft data, such as the confidence of respective bit values, can be determined.

For MLC memory devices, the majority of read errors are single state errors, e.g., single level errors. Single level errors refer to a detected state being one state different than the state to which a memory cell was programmed. Single state errors can cause one or more errors in the bits in the data value corresponding to the detected state as compared to the bits in the data value corresponding to the state to which a memory cell was programmed. Where the data value arrangement utilizes gray coding, a single state error corresponds to a single bit error for configurations except when swapping occurs.

Decoders of some error-correction codes (ECCs), such as low-density parity-check (LDPC) codes, can use soft data such as log-likelihood ratios (LLR) data. Confidence information, e.g., in the reliability of a particular data value, about a binary data value can be expressed as an LLR, which is calculated as:

$$LLR = \log\left(\frac{P(0)}{P(1)}\right),$$

where P(0) is a conditional probability that a bit of a data value has a first value, e.g., zero (given the received noisy data from the channel such as a Flash memory), and P(1) is a conditional probability that a bit of a data value has a second value, e.g., one (given the received noisy data from the channel such as a Flash memory). When full confidence is attributed to a detected state the above formula results in positive infinity when a state representing a '0' is detected since $$LLR = \log\left(\frac{1}{0}\right)$$
$$= \log(\infty)$$
$$= \infty,$$

and negative infinity when a state representing a "1" is detected since $$LLR = \log\left(\frac{0}{1}\right)$$
$$= \log(0)$$
$$= -\infty.$$

The measure of confidence can be truncated to one bit, returning +1 in place of positive infinity and returning −1 in place of negative infinity responsive to a read request, for example.

Soft data can be determined from a hard read of a memory cell to determine the detected state based on a particular data value arrangement, and the changes to bits of the data value that occur when the detected state of a memory cell is different than the state to which the memory cell was programmed. Confining the possibility of error in detected state to the most-likely single level error(s), soft data can be determined from a hard read efficiently. The following discussion briefly illustrates an example of determining soft data in this manner.

Table 450 shown in FIG. 4 indicates a current read state 452, e.g., the state to which data value 01 corresponds. The right adjacent state 454 is shown to correspond to data value 00, and the left adjacent state 456 is shown to correspond to data value 11. The current state detected for the memory cell may, or may not, be in error with respect to the state to which the memory cell was programmed. For instance, the Vt of the memory cell may have shifted since being programmed. The most likely state(s) of a memory cell can be used to quantify confidence in the bits of the data value corresponding to the current state detected.

FIG. 4 shows the most significant bit (MSB) of the data value corresponding to the current state detected is a 0. If the memory cell being read was actually programmed to the left state 456, the current state 452 detected results in an error in the MSB as shown at 457, but does not result in an error in the least significant bit (LSB) of the data value corresponding to the current state detected, as shown at 458. If the memory cell being read was actually programmed to the right state 454, the current state 452 detected does not result in an error in the MSB as shown at 459, but does result in an error in the LSB of the data value corresponding to the current state detected, as shown at 460. The fact that a particular bit of a data value corresponding to the current state detected may, or may not, be in error if the state is in error can be reflected in the soft data, e.g., LLR, associated with a particular bit of the data value corresponding to the detected state.

Bit errors in data values can vary depending on whether gray coding is utilized, and/or whether the current state detected is an end state, e.g., a highest state, etc. The states shown in FIG. 4 correspond to those provided in Table 5 above. As discussed above, detection of a highest state, e.g., state 4, in a memory cell can be used to determine various bits of a data value depending on the dimension to which the memory cell corresponds. Detecting the highest state can indicate a swapping shell 461, e.g., Case II, mapping technique applies, which can impact the determination of soft data for this and other memory cells of a group of memory cells. Also, the soft data, e.g., LLRs, determined for bits of data values corresponding to states at ends of a particular data value arrangement can be different from the soft data determined for bits of data values corresponding to states that have two adjacent states.

The method for determining soft data from a hard read described with respect to the data value arrangement examples illustrated in FIG. 4 can be generalized for wider applicability as follows. With respect to memory cells having an integer, e.g., non-fractional, number of bits/cell, the following one dimensional approach can be used to determine a respective associated LLR for each bit in a cell as follows.

The probability of the threshold voltage, $V_t$, e.g., read voltage, can be determined given each of the $N_L$ state distributions in the cell, $V_L$: $Pr(V_t|V_L)$ for $L=0:N_L-1$. The index L refers to "level" (used herein interchangeably in referring to a state). The probability of the threshold voltage, $V_t$, is the Probability Mass Function (PMF) for the given memory cell. The threshold voltage, $V_t$, can be determined by a hard read of the memory cell. The threshold voltage, $V_t$, is used to determine the $Pr(V_t|V_L)$ probabilities. For a given b, 0, 1, the states that are used for numerator and denominator in the equation for LLR shown below based on the underlying data values arrangement, e.g., data values corresponding to particular states of a memory cell, can be accomplished ahead of reading a particular memory cell.

Soft data, e.g., a LLR, can be determined with respect to each bit as the log of the ratio of the sum of the conditional probabilities with the $b^{th}$ bit of state L being 0 versus 1:

$$LLR_b = \log \frac{\sum_{L \in L_b=0} Pr(V_t | V_L)}{\sum_{L \in L_b=1} Pr(V_t | V_L)}$$

In this manner, LLRs can be determined based on the $V_t$ belonging to each of the possible states. As a state error may possibly be limited to the nearest adjacent state, determining the probability of a threshold voltage, $V_t$, can be simplified where only the current state and its nearest adjacent state probabilities are used.

The discussion above related to reading the memory cells of the group of memory cells and unpacking the Case I and II mapping techniques ignored errors in the detected states. However, errors can happen such that the detected states of one or more of the memory cells of the group of memory cells can be different than the state to which the respective memory cell was programmed. Errors in detected states can incorrectly indicate whether Case I or Case II mapping applies, and thus the binary value of the most significant bit of the 9-bit data value being determined, and can further cause errors in the state corresponding to the remaining eight bits of the 9-bit data value being determined either by affecting the state to 2-bit data value correspondence, or by affecting the mapping scheme correspondence between memory cell and bits of the 9-bit data value being determined.

The method described above for determining soft data, e.g., LLRs, for integer number of bits per memory cell can be extended to fractional bits per memory cell, e.g., bits per cell (BPC) configurations. However, the PMF determination is different for fractional bit per memory cell configurations. Fractional bits per memory cell configurations utilize multiple memory cells together to store an integer number of bits, with each memory cell storing a non-integer quantity of bits. As such, fractional bits per memory cell configurations are referred to as having multiple dimensions, the dimension being equal to the quantity of memory cells that are operated together to store an integer number of bits. For example, a configuration utilizing two 1½ bit, e.g., three-state, memory cells is referred to as a 2 dimension configuration. N-dimension memory cell configurations are possible as well, including 4 dimensions, e.g., four 2.25 bit memory cells, 8 dimensions, e.g., eight 3.125 bit memory cells, etc.

When data packing is used, and/or as the number of dimensions increase in the packing, the complexity of determining soft data, e.g., LLRs, increases. In particular, the packing technique can be accounted for in determining the soft data since swapping can change the interpretation of adjacent states. As mentioned above, the majority of errors are single-level errors. Therefore, the current state and its nearest adjacent states can be used to determine the LLR. The nearest adjacent state are the state adjacent the state detected by a hard read, e.g., states neighboring the detected state such as to the left and to the right of the detected state in a one dimensional arrangement of states.

In a 4 dimension packing scheme, four dimensions refer to four memory cells being used to store a data value corresponding to an integer quantity of bits. The four dimensions can be enumerated d=0, 1, 2, and 3. The inputs used to determine the soft data, e.g., LLRs, are the three probabilities associated with each memory cell, including the probability of the current (detected) state, and the two adjacent states, e.g., left state and the right state. This set of probabilities is referred to as the Probability Mass Function for each dimension d ($PMF_d$). The states corresponding to the four dimensions can be used to perform a reverse mapping to bits of a data value, b[8:0], and determine the soft data, e.g., LLR, corresponding to each bit of the data value. In Table 6 below, L(d,L/C/R) refers to the left adjacent, current, or right adjacent state in dimension d and Pr(L(d,L/C/R)) refer to their corresponding probabilities. As previously indicated, "Level" refers to a state. As an example of determining LLRs for configurations having 4 dimensions, Table 6 describes the probabilities used in LLR determination for 2.25 bits/cell with 5 states, e.g., 0, 1, 2, 3, 4, in each memory cell.

TABLE 6

2.25 Bits/Cell Probability Mapping per Cell

|  | Dim 3 | | Dim 2 | | Dim 1 | | Dim 0 | |
| --- | --- | --- | --- | --- | --- | --- | --- | --- |
|  | Pr | Level | Pr | Level | Pr | Level | Pr | Level |
| Left | Pr(L(3, L)) | L(3, L) | Pr(L(2, L)) | L(2, L) | Pr(L(1, L)) | L(1, L) | Pr(L(1, L)) | L(0, L) |
| Current | Pr(L(3, C)) | L(3, C) | Pr(L(2, C)) | L(2, C) | Pr(L(1, C)) | L(1, C) | Pr(L(1, C)) | L(0, C) |
| Right | Pr(L(3, R)) | L(3, R) | Pr(L(2, R)) | L(2, R) | Pr(L(1, R)) | L(1, R) | Pr(L(1, R)) | L(0, R) |

In order to determine LLRs, the PMF for each dimension is determined. If the particular data packing mapping does not utilize swapping, the PMF for each dimension is simply the probability of the left adjacent, current, and right adjacent states, which is the case for a single dimension configuration, e.g., integer bits stored in one memory cell, as described above. However, if one or more dimensions have a detected/ right adjacent state corresponding to the second shell (Case II) mapping, e.g., state 4 for BPC=2.25, then swapping might have occurred.

In this example, swapping occurs between the highest dimension, e.g., dimension 3 in this example, and one of the other dimensions. The PMF determination can account for swapping between dimensions. If swapping between dimensions has occurred, each dimension cannot be treated independently. Since dimension 3 holds the state for the swapped dimension, it can be treated separately. Only dimension 3 and those dimensions who have a second highest detected state, e.g., state 3 (since the right adjacent state will be a highest state 4), or a highest state 4, will be treated uniquely since these two dimensions are correlated according to the packing technique being used.

There are three general cases to handle in the PMF determination. The first general case is when the dimensions are not candidates for swapping, e.g., those dimensions whose detected state does not correspond to, and is not adjacent to, the second shell. That is, a single level error to a memory cell programmed to state corresponding to the second shell can result in a state corresponding to the second shell being detected, or result in a state adjacent to the second shell being detected. Therefore, those dimensions whose detected state is not adjacent to, or corresponding to, the second shell indicates that even if a single level error has occurred, the dimension was not programmed to a state corresponding to the second shell. According to the present example, a state adjacent a state corresponding to the second shell is the second highest state, e.g., less than or equal to state 2 in this example, since only the highest state corresponds to the second shell. Each of these dimensions whose detected state is not adjacent to, or corresponding to, the second shell gets treated independently as a single dimension. As such, the associated PMF is the probability of the left adjacent, current, and right adjacent states (Equation 1 in Table 7 below). Equation 1 pertains to dimensions where the detected state is less than the second highest state, e.g., state 3 in this example, and no swapping is involved. Therefore, each dimension gets treated independently as a single dimension.

The second general case is when swapping has occurred. The PMF for the highest dimension, e.g., dimension 3 in this example, can be determined for two scenarios as follows. According to one scenario, the PMF for the highest dimension can be determined based on the probabilities of its left adjacent, current, and right adjacent states, given that no other dimension took the highest state, e.g., state 4 in this example, as set forth in Equations 2-4 in Table 7 below. Equations 2-4 are used to determine the probability that the highest dimension, e.g., dimension 3 in this example, is programmed to its left adjacent/current/right adjacent state. This is only valid when the remaining dimensions are not programmed to the highest state, e.g., state 4 in this example, which indicates that no swapping is involved. According to another scenario, the PMF for the highest dimension can be determined based on the probability that one of the other dimensions had a detected highest state, e.g., state 4 in this example, and the remaining dimensions all had states less than the highest state, e.g., state 4 in this example, as set forth in Equation 5 in Table 7 below. Equation 5 is used to determine the probability of each dimension which is a candidate for swapping. Note that in Case II of the packing technique, bits b[7:6] determine which dimension stores the highest state, e.g., state 4 in this example, and a state corresponding to the 2 bits associated with that dimension is stored in the highest dimension, e.g., dimension 3 in this example. D is the set of dimensions whose current state is greater than or equal to the second highest state, e.g., state 3 in this example. If the detected state is equal to the highest state, e.g., state 4 in this example, than that dimension is a candidate for swapping. If the detected state is equal to the second highest state, e.g., state 3 in this example, than the right adjacent state is programmed to the highest state, e.g., state 4 in this example, and so it is a candidate for swapping.

The second general case is for all the other dimensions that are candidates for swapping with the highest dimension, e.g., dimension 3 in this example. The PMF can be determined for two scenarios as follows. According to one scenario, the probabilities of the left adjacent/current/right adjacent states for the highest dimension, e.g., dimension 3 in this example, given that the current dimension, e.g., dimension that is a candidate for swapping with the highest dimension, is programmed to the highest state, e.g., state 4 in this example, and that the remaining dimensions are not programmed to the highest state, e.g., state 4 in this example, as set forth in Equations 6-8 in Table 7 below. Equations 6-8 are used to determine the probability that the swapped dimension, e.g., dimension swapped with the highest dimension, is programmed to the left adjacent, current, and right adjacent state probabilities of the highest dimension, e.g., dimension 3 in this example. This is only valid when the current dimension is programmed to the highest state, e.g., state 4 in this example, and the remaining dimensions are not programmed to the highest state, e.g., state 4 in this example.

According to another scenario, the probability of the current dimension being its left adjacent state and current state, given the current state is not the highest state, e.g., state 4 in this example, as set forth in Equations 9 and 10 in Table 7 below. Equations 9-10 are used to determine the probability that the current dimension is programmed to the detected and adjacent left state given that they are not equal to the highest state, e.g., state 4 in this example.

TABLE 7

Equations for Computing PMFs in 4 Dimensions

Let $D = \{\text{dimensions with } L_c \geq 3\}$:
For $L_C^d < 3$:
(1) $\text{PMF}_d = \{P(L_L^d), P(L_C^d), P(L_R^d)\}$
For $d = 3$:

(2) $P(L^3 = L_L^3) = P(L_L^3) \times \prod_{i \in D} (1 - P(4^i))$ (3) $P(L^3 = L_C^3) = P(L_C^3) \times \prod_{i \in D} (1 - P(4^i))$ (4) $P(L^3 = L_R^3) = P(L_R^3) \times \prod_{i \in D} (1 - P(4^i))$ (5) $P(L^3 = i \in D) = P(4^i) \times \prod_{\substack{j \in D \\ j \neq i}} (1 - P(L^j = 4))$ For $d \in D$ & $d \neq 3$:

(6) $P(L^d = L_L^3) = P(L_L^3) \times P(4^d) \times \prod_{\substack{i \in D \\ i \neq d}} (1 - P(L^i = 4))$ (7) $P(L^d = L_C^3) = P(L_C^3) \times P(4^d) \times \prod_{\substack{i \in D \\ i \neq d}} (1 - P(L^i = 4))$

TABLE 7-continued

Equations for Computing PMFs in 4 Dimensions (8) $P(L^d = L_R^3) = P(L_R^3) \times P(4^d) \times \prod_{\substack{i \in D \\ i \neq d}} (1 - P(L^i = 4))$ (9) $P(L^d = (L_C^d \neq 4)) = P(L_C^d)$

(10) $P(L^d = L_L^d) = P(L_L^d)$

The following illustrates a specific example case for a 4-dimension configuration, e.g., memory cells 3 to 0, with 2.25 bits/cell. In this example, the detected states for dimension 3 to 0 are [2, 1, 4, 4]. Table 8 below shows the current state ($L_C$), left adjacent state ($L_L$), and right adjacent state ($L_R$) for each dimension, e.g., memory cell. Dimensions 0 and 1 do not have a right adjacent state since they have each been detected as being programmed to the highest state.

TABLE 8

2.25 BPC Example: Detected and Adjacent States

| | Dimension | | | |
|---|---|---|---|---|
| | $D_3$ | $D_2$ | $D_1$ | $D_0$ |
| $L_L$ | 1 | 0 | 3 | 3 |
| $L_C$ | 2 | 1 | 4 | 4 |
| $L_R$ | 3 | 2 | — | — |

Table 9 below shows all the valid permutations for each dimension, accounting for swapping between dimensions that may have occurred. Note that since dimension 2 is not part of any possible swapping cases because its detected state is less than the second highest state, e.g., less than state 3 in this example, it is treated as an independent single dimension and the soft data, e.g., LLR, can be determined independently from the other dimensions using Equation 1 in Table 7.

TABLE 9

2.25 BPC Example: Possible Valid Packing Mappings

| | Dimension | | | |
|---|---|---|---|---|
| $b_8$ | $D_3$ | $D_2$ | $D_1$ | $D_0$ |
| 0 | 1 | X | 3 | 3 |
| 0 | 2 | X | 3 | 3 |
| 0 | 3 | X | 3 | 3 |
| 1 | 0 | X | 3 | 1 |
| 1 | 0 | X | 3 | 2 |
| 1 | 0 | X | 3 | 3 |
| 1 | 1 | X | 1 | 3 |
| 1 | 1 | X | 2 | 3 |
| 1 | 1 | X | 3 | 3 |

Computing PMFs for each of the 4 dimensions using the equations set forth in Table 7 above:

Dimension 3

According to Table 8 above, the highest dimension, e.g., dimension 3 in this example, was detected being at state 2 and existence of highest state, e.g., state 4 in Table 8, indicates that potential swapping scenarios be considered. Therefore, Equations 2-4 (probabilities that the dimension is the left adjacent, currently detected, and right adjacent states) and 5 (probabilities that the dimension is the state of the dimension with which it may have been swapped) are applicable since other dimensions are detected at the highest state, and are determined as follows:

$P(L^3 = 1) = P(L^3 = 1) \times P(L^1 = 3) \times P(L^0 = 3)$
$\quad = P(L^3 = 1) \times (1 - P(L^1 = 4)) \times (1 - P(L^0 = 4))$ $P(L^3 = 2) = P(L^3 = 2) \times P(L^1 = 3) \times P(L^0 = 3)$
$\quad = P(L^3 = 2) \times (1 - P(L^1 = 4)) \times (1 - P(L^0 = 4))$ $P(L^3 = 3) = P(L^3 = 3) \times P(L^1 = 3) \times P(L^0 = 3)$
$\quad = P(L^3 = 3) \times (1 - P(L^1 = 4)) \times (1 - P(L^0 = 4))$ $P(L^3 = 0) = P(L^0 = 4) \times P(L^1 = 3)$ $P(L^3 = 1) = P(L^1 = 4) \times P(L^0 = 3)$ Dimension 1

According to Table 8 above, dimension 1 is not the highest dimension, e.g., dimension 3 in this example, and dimension 1 was detected being at the highest state, state 4. As such, dimension 1 is a candidate for swapping with the highest dimension, e.g., dimension 3 in this example. However, another dimension, e.g., dimension 0 in this example, is also detected to being the highest state; therefore Equations 6-10 are applicable. As such, the probabilities to consider for the PMF are the probability that dimension 1 is programmed to the left adjacent state, e.g., state 3 in this example, and the probabilities that dimension 1 is programmed to one of the left adjacent/current/right adjacent states of the highest dimension, e.g., dimension 3 in this example, with which dimension 1 might have been swapped (Equations 6-8) as follows:

$P(L^1=3)=P(L^1=3)$ $P(L^1=1)=P(L^3=1) \times P(L^1=4) \times P(L^0=3)$ $P(L^1=2)=P(L^3=2) \times P(L^1=4) \times P(L^0=3)$ $P(L^1=3)=P(L^3=3) \times P(L^1=4) \times P(L^0=3)$ Dimension 0

According to Table 8 above, dimension 0 is not the highest dimension, e.g., dimension 3 in this example, and dimension 0 was detected being at the highest state, state 4. As such, dimension 0 is also a candidate for swapping with the highest dimension, e.g., dimension 3 in this example. As such, dimension 0 is evaluated the same as discussed with respect to dimension 1 above:

$P(L^0=3)=P(L^0=3)$ $P(L^0=1)=P(L^3=1) \times P(L^1=3) \times P(L^0=4)$ $P(L^0=2)=P(L^3=2) \times P(L^1=3) \times P(L^0=4)$ $P(L^0=3)=P(L^3=3) \times P(L^1=3) \times P(L^0=4)$ The Probability Mass Function (PMF) for eight dimensions can be determined as described as follows. Eight dimensions refer to eight fractional bit per cell memory cells being used to store a data value comprising an integer quantity of bits. The eight dimensions are labeled 0, 1, 2, 3, 4, 5, 6, 7. The PMF computation over 8 dimensions is similar to that described above for 4 dimensions. However, the highest dimension is now dimension 7. In case of swapping, only one dimension is swapped with the highest dimension, e.g., dimension 7 in this example, rather than dimension 3. Assuming, 3.125 bits/cell over 8 cells and 9-states per cell, the highest state for this configuration is state 8. The equations that can be used for computing PMFs in 8 dimensions are shown below in Table 10.

TABLE 10

Equations for Computing PMFs in 8 Dimensions

Let $D = \{\text{dimensions with } L_c \geq 7\}$:
  For $L_C^d < 7$:
    (1) $PMF_d = \{P(L_L^d), P(L_C^d), P(L_R^d)\}$
  For $d = 7$:

(2) $P(L^7 = L_L^7) = P(L_L^7) \times \prod_{i \in D} (1 - P(8^i))$ (3) $P(L^7 = L_C^7) = P(L_C^7) \times \prod_{i \in D} (1 - P(8^i))$ (4) $P(L^7 = L_R^7) = P(L_R^7) \times \prod_{i \in D} (1 - P(8^i))$ (5) $P(L^7 = i \in D) = P(8^i) \times \prod_{\substack{j \in D \\ j \neq i}} (1 - P(L^j = 8))$ For $d \in D$:

(6) $P(L^d = L_L^7) = P(L_L^7) \times P(8^d) \times \prod_{\substack{i \in D \\ i \neq d}} (1 - P(L^i = 8))$ (7) $P(L^d = L_C^7) = P(L_C^7) \times P(8^d) \times \prod_{\substack{i \in D \\ i \neq d}} (1 - P(L^i = 8))$ (8) $P(L^d = L_R^7) = P(L_R^7) \times P(8^d) \times \prod_{\substack{i \in D \\ i \neq d}} (1 - P(L^i = 8))$ (9) $P(L^d = (L_C^d \neq 8)) = P(L_C^d)$

(10) $P(L^d = L_L^d) = P(L_L^d)$

According to a number of embodiments, computation of the Probability Mass Function can be done in the log domain so that the multiplications can be replaced with summations, which can be computationally more efficient to implement in digitally-based controllers. The log domain equations that can be used for computing PMFs in 8 dimensions are shown below in Table 11.

TABLE 11

Equations for Computing PMFs in Log Domain for 8 Dimensions

Let $D = \{\text{dimensions with } L_c \geq 7\}$:
  For $L_C^d < 7$:
    (1) $PMF_d = \{\log(P(L_L^d)), \log(P(L_C^d)), \log(P(L_R^d))\}$
  For $d = 7$:

(2) $\log(P(L^7 = L_L^7)) = \log(P(L_L^7)) + \sum_{i \in D} \log((1 - P(8^i)))$ (3) $\log(P(L^7 = L_C^7)) = \log(P(L_C^7)) + \sum_{i \in D} \log((1 - P(8^i)))$ (4) $\log(P(L^7 = L_R^7)) = \log(P(L_R^7)) + \sum_{i \in D} \log((1 - P(8^i)))$ (5) $\log(P(L^7 = i \in D)) = \log(P(8^i)) + \sum_{\substack{j \in D \\ j \neq i}} \log((1 - P(L^j = 8)))$ For $d \in D$:

(6) $\log(P(L^d = L_L^7)) = \log(P(L_L^7)) + \log(P(8^d)) + \sum_{\substack{i \in D \\ i \neq d}} \log((1 - P(L^i = 8)))$ (7) $\log(P(L^d = L_C^7)) = \log(P(L_C^7)) + \log(P(8^d)) + \sum_{\substack{i \in D \\ i \neq d}} \log((1 - P(L^i = 8)))$ (8) $\log(P(L^d = L_R^7)) = \log(P(L_R^7)) + \log(P(8^d)) + \sum_{\substack{i \in D \\ i \neq d}} \log((1 - P(L^i = 8)))$ (9) $\log(P(L^d = (L_C^d \neq 8))) = \log(P(L_C^d))$

(10) $\log(P(L^d = L_L^d)) = \log(P(L_L^d))$

The following specific example illustrates a case for 3.125 bits/cell where the detected states for dimension 7 to 0 are [2,X,X,X,X,X, 8,8]. Table 12 below shows the current and left adjacent/right adjacent states for each dimension. Note that since dimensions 6-3 are not part of any possible swapping cases (their current state is less than second highest state, which is 7 in this example), they can be treated as an independent single dimension, and the soft data, e.g., LLR, can be determined independently from the other dimensions using Equation 1 in Tables 10 (or 11 in the log domain). As such, for purposes of illustrating the methods of the present disclosure, dimensions 7, 1, and 0 are of interest and discussed further below.

TABLE 12

3.125 BPC Example: Detected & Nearest Adjacent States

| | Dimension | | | | | | | |
|---|---|---|---|---|---|---|---|---|
| | 7 | 6 | 5 | 4 | 3 | 2 | 1 | 0 |
| $L_L$ | 1 | | | | | | 7 | 7 |
| $L_C$ | 2 | X | X | X | X | X | 8 | 8 |
| $L_R$ | 3 | | | | | | | |

Table 13 below shows all the valid permutations for each of the dimensions of interest, e.g., dimensions 7, 1, and 0 in this example. Note that since dimensions 2-6 are not part of the possible swapping cases; therefore, they can each simply be treated as independent single dimensions, e.g., no consideration of swapping with another dimension, and need not be discussed further here.

TABLE 13

3.125 BPC Example: Possible Valid Packing Mappings

| $b_{24}$ | $D_7$ | $D_1$ | $D_0$ |
|---|---|---|---|
| 0 | 1 | 7 | 7 |
| 0 | 2 | 7 | 7 |
| 0 | 3 | 7 | 7 |
| 1 | 0 | 7 | 1 |
| 1 | 0 | 7 | 2 |
| 1 | 0 | 7 | 3 |
| 1 | 1 | 1 | 7 |
| 1 | 1 | 2 | 7 |
| 1 | 1 | 3 | 7 |

The probabilities used in computing PMFs for each of the dimensions of interest (using the equations set forth in Table 10 above):

Dimension 7

According to Table 12 above, the highest dimension, e.g., dimension 7 in this example, was detected being at state 2 and existence of highest state, e.g., state 8 in Table 12, indicates that potential swapping scenarios be considered. Therefore, Equations 2-4 (probabilities that the dimension is the left adjacent, currently detected, and right adjacent states) and 5 (probabilities that the dimension is the state of the dimension 0 or 1 with which it may have been swapped) are applicable since dimensions 0 and 1 are detected at the highest state, and are determined as follows:

$$P(L^7 = 1) = P(L^7 = 1) \times P(L^1 = 7) \times P(L^0 = 7)$$
$$= P(L^7 = 1) \times (1 - P(L^1 = 8)) \times (1 - P(L^0 = 8))$$
$$P(L^7 = 2) = P(L^7 = 2) \times P(L^1 = 7) \times P(L^0 = 7)$$
$$= P(L^7 = 2) \times (1 - P(L^1 = 8)) \times (1 - P(L^0 = 8))$$
$$P(L^7 = 3) = P(L^7 = 3) \times P(L^1 = 7) \times P(L^0 = 7)$$
$$= P(L^7 = 3) \times (1 - P(L^1 = 8)) \times (1 - P(L^0 = 8))$$
$$P(L^7 = 0) = P(L^0 = 8) \times P(L^1 = 7)$$
$$P(L^7 = 1) = P(L^1 = 8) \times P(L^0 = 7)$$

Dimension 1

According to Table 12 above, dimension 1 is not the highest dimension, e.g., dimension 7 in this example, and dimension 1 was detected being at the highest state, state 8. As such, dimension 1 is a candidate for swapping with the highest dimension, e.g., dimension 7 in this example. However, another dimension, e.g., dimension 0 in this example, is also detected to being the highest state. Therefore, the probabilities to consider for the PMF are the probability that dimension 1 is the left adjacent state, e.g., state 7 in this example, and the probabilities that dimension 1 is programmed to one of the left adjacent/current/right adjacent states of the highest dimension, e.g., dimension 7 in this example, with which it might have been swapped (Equations 6-8 in Table 11) as follows:

$$P(L^1=7)=P(L^1=7)$$
$$P(L^1=1)=P(L^7=1) \times P(L^1=8) \times P(L^0=7)$$
$$P(L^1=2)=P(L^7=2) \times P(L^1=8) \times P(L^0=7)$$
$$P(L^1=3)=P(L^7=3) \times P(L^1=8) \times P(L^0=7)$$

Dimension 0

According to Table 12 above, dimension 0 is not the highest dimension, e.g., dimension 7 in this example, and dimension 0 was detected being at the highest state, state 8. As such, dimension 0 is also a candidate for swapping with the highest dimension, e.g., dimension 7 in this example. As such, dimension 0 is evaluated the same as discussed with respect to dimension 1 above:

$$P(L^0=7)=P(L^0=7)$$
$$P(L^0=1)=P(L^7=1) \times P(L^1=7) \times P(L^0=8)$$
$$P(L^0=2)=P(L^7=2) \times P(L^1=7) \times P(L^0=8)$$
$$P(L^0=3)=P(L^7=3) \times P(L^1=7) \times P(L^0=8)$$

Figure 5:
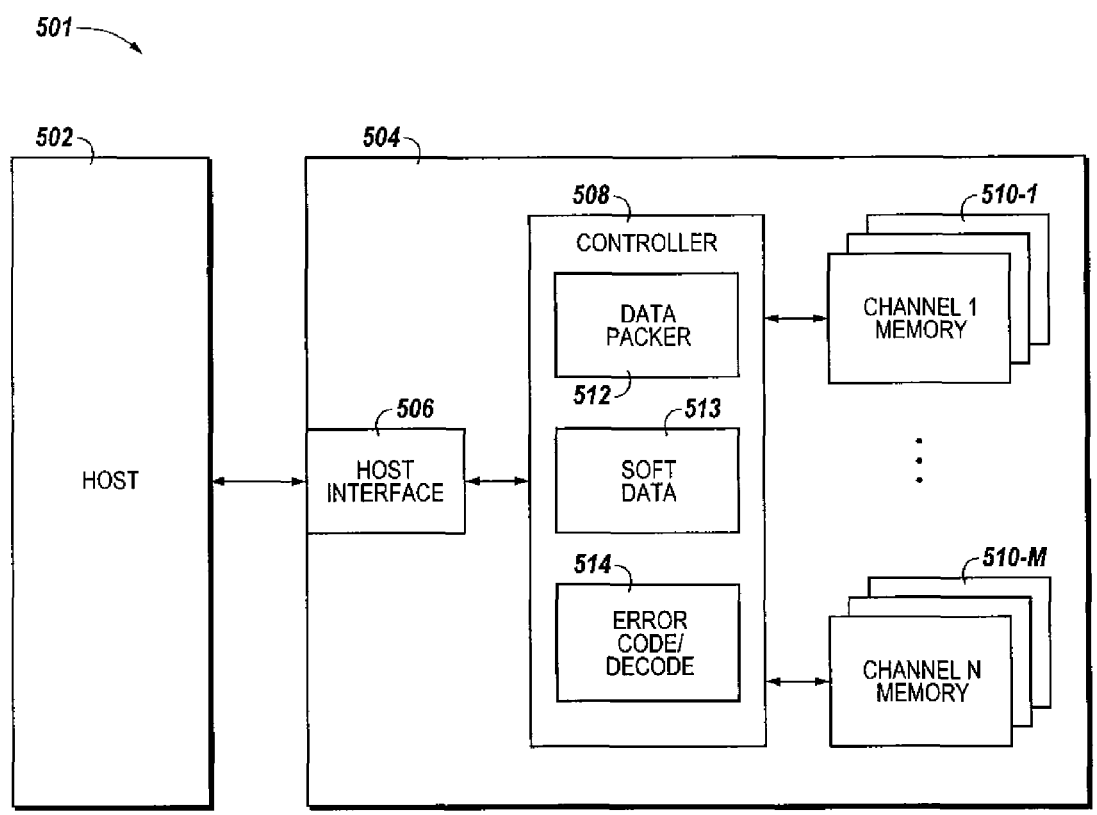
FIG. 5 is a block diagram of an apparatus in the form of a computing system including at least one memory system in accordance a number of embodiments of the present disclosure.

FIG. 5 is a block diagram of an apparatus in the form of a computing system 501 including at least one memory system 504 in accordance with a number of embodiments of the present disclosure. As used herein, a memory system 504, a controller 508, or a memory device 510 might also be separately considered an "apparatus". The memory system 504 can be a solid state drive (SSD), for instance, and can include a host interface 506, a controller 508, e.g., a processor and/or other control circuitry, and a number of memory devices 510-1, ..., 510-M, e.g., solid state memory devices such as NAND flash devices, which provide a storage volume for the memory system 504. In a number of embodiments, the controller 508, a memory device 510-1 to 510-M, and/or the host interface 506 can be physically located on a single die or within a single package, e.g., a managed NAND application. Also, in a number of embodiments, a memory, e.g., memory devices 510-1 to 510-M, can include a single memory device.

As illustrated in FIG. 5, the controller 508 can be coupled to the host interface 506 and to the memory devices 510-1, ..., 510-M via a plurality of channels and can be used to transfer data between the memory system 504 and a host 502. The interface 506 can be in the form of a standardized interface. For example, when the memory system 504 is used for data storage in a computing system 500, the interface 506 can be a serial advanced technology attachment (SATA), peripheral component interconnect express (PCIe), or a universal serial bus (USB), among other connectors and interfaces. In general, however, interface 506 can provide an interface for passing control, address, data, and other signals between the memory system 504 and a host 502 having compatible receptors for the interface 506.

Host 502 can be a host system such as a personal laptop computer, a desktop computer, a digital camera, a mobile telephone, or a memory card reader, among various other types of hosts. Host 502 can include a system motherboard and/or backplane and can include a number of memory access devices, e.g., a number of processors.

The controller 508 can communicate with the memory devices 510-1, ..., 510-M to control data read, write, and erase operations, among other operations. The controller 508 can include, for example, a number of components in the form of hardware and/or firmware, e.g., one or more integrated circuits, and/or software for controlling access to the number of memory devices 510-1, ..., 510-M and/or for facilitating data transfer between the host 502 and memory devices 510-1, ..., 510-M. For instance, in the example illustrated in FIG. 5, the controller 508 includes a data packer/unpacker component 512, a soft data component 513, and an error correcting code encoder/decode component 514. However, the controller 508 can include various other components not illustrated so as not to obscure embodiments of the present disclosure. Also, the components 512, 513, and/or 514 may not be components of controller 508, in some embodiments, e.g., the components 512, 513 and/or 514 can be independent components.

The data packer/unpacker component 512 can be used in association with mapping between memory cell program states and data in accordance with a number of embodiments described herein. The soft data component 513 can be used to determine soft data, e.g., from a hard read. The error correcting code encoder/decode component 514 can be an LDPC encoder/decoder, for instance, which can encode/decode user data transferred between host 502 and the memory devices 510-1, ..., 510-M. The soft data component 513 can be communicatively coupled to the data packer/unpacker component 512, for example, to receive dimension and/or configuration information associated with particular memory devices 510-1, ..., 510-M. The soft data component 513 can also be communicatively coupled to the error correcting code encoder/decode component 514, for example, to provide soft data thereto.

The memory devices 510-1, ..., 510-M can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

Figure 6:
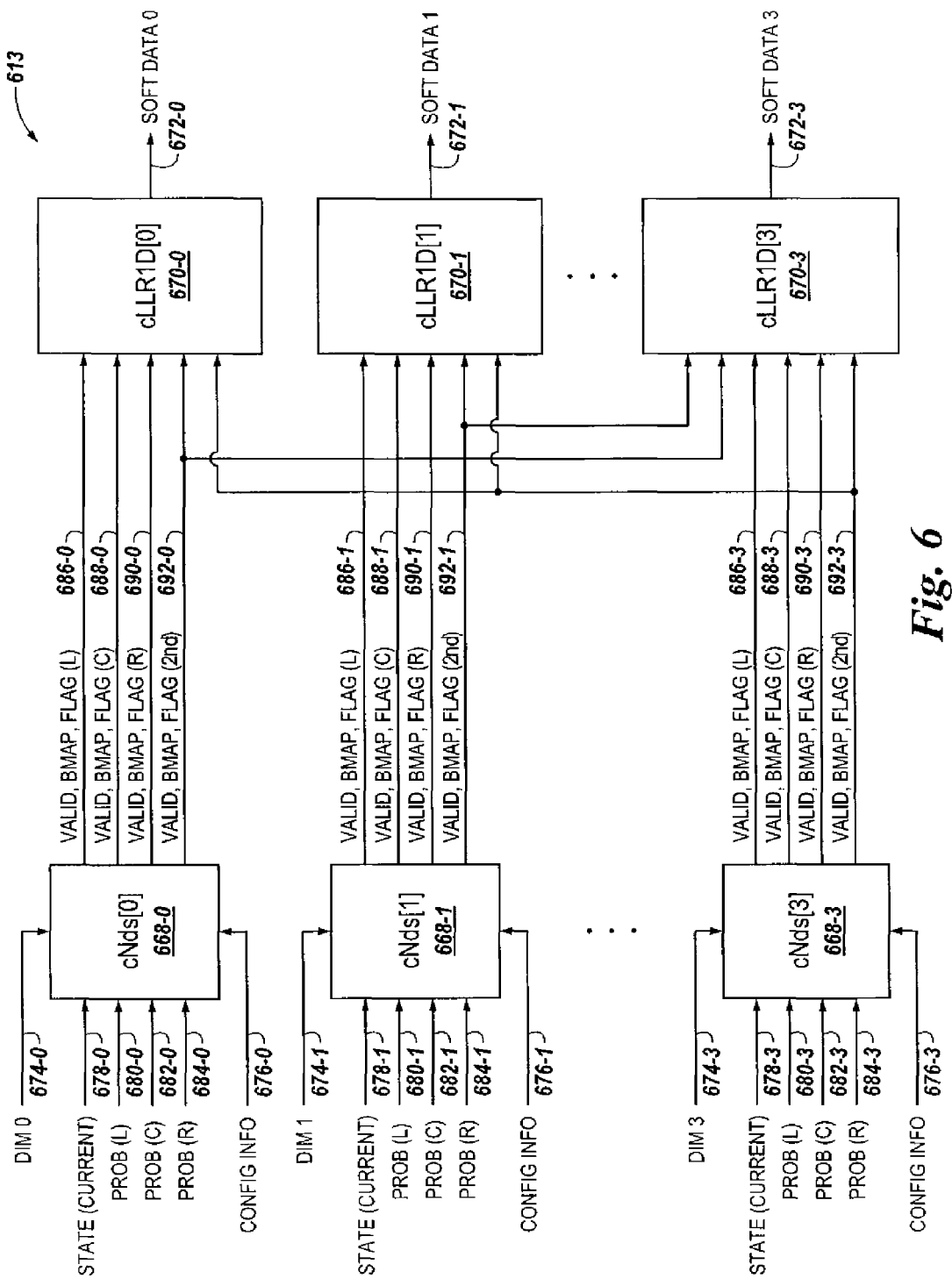
FIG. 6 is a block diagram of an example soft data component in accordance with a number of embodiments of the present disclosure.

FIG. 6 is a block diagram of an example soft data component 613 in accordance with a number of embodiments of the present disclosure. Although FIG. 6 illustrates one example apparatus for implementing a method for determining soft data for fractional bit memory cells, embodiments of the present disclosure are not limited to this particular implementation, and other configurations and/or hardware can be used to implement the methods described herein.

For each memory cell corresponding to a dimension, determining soft data can include processing by two sub-components, e.g., sub-blocks, labeled in FIG. 6 as sub-component cNds[X] 668-X and cLLR1D[X] 670-X, where X represents the dimension. The implementation shown in FIG. 6 is for a 2.25 bits per memory cell configuration involving 4 dimensions, e.g., 0-3 (the sub-components corresponding to dimension 2 are not shown). The main functionality of the cNds[X] sub-components 668-0, ..., 668-3 can be to determine the Probability Mass Function (PMF) corresponding to each dimension. The main functionality of the cLLR1D[X] sub-components 670-0, ..., 670-3 can be to determine a sub-set of valid PMFs corresponding to each dimension, and compute the soft data, e.g., a log likelihood ratio (LLR).

The cNds[X] sub-components 668-0, ..., 668-3 can receive input signals corresponding to the respective dimension on input signal lines, including dimension identification on a dimension identification input 674-0, ..., 674-3, current (detected) state on a state (current) input 678-0, ..., 678-3, the probability associated with the detected state on a Prob(C) input 682-0, ..., 682-3, the probability associated with one or two adjacent states of the detected state, and configuration information corresponding to the dimension on a Config Info input 676-0, ..., 676-3. FIG. 6 shows the probability associated with one or two adjacent states of the detected state including the probability associated with the left adjacent state of the detected state on a Prob(L) input 680-0, ..., 680-3, and the probability associated with the right adjacent state of the detected state on a Prob(R) input 684-0, ..., 684-3. The configuration information corresponding to the dimension received to the cNds[X] sub-components 668-0, ..., 668-3 at the Config Info input 676-0, ..., 676-3 can include, for example, a number of bits/cell, a state mapping, and a quantity of program states/cell, among other configuration information.

The cNds[X] sub-components 668-0, ..., 668-3 can process the received input signals and output a number of signals on outputs, which can correspond to input signals on inputs for the cLLR1D[X] sub-components 670-0, ..., 670-3. For example, the cNds[X] sub-components 668-0, ..., 668-3 can provide signals corresponding to whether the left adjacent, current (detected), and/or right adjacent states are valid, the bit-mapping for the left adjacent, current, and right adjacent states, and an indication of whether the current or right state can belong to the second shell, e.g., Case II.

FIG. 6 shows the above information communicated via a cNds[X] sub-components 668-0, ..., 668-3 output/cLLR1D [X] sub-components 670-0, ..., 670-3 input corresponding to the current state, states adjacent the current state, and the $2^{nd}$ shell. That is, FIG. 6 shows cNds[X] sub-components 668-0, ..., 668-3 providing a signal corresponding to whether the left adjacent state is valid and the bit-mapping for the left adjacent state on the left adjacent state output/input 686-0, ..., 686-3. Likewise, cNds[X] sub-components 668-0, ..., 668-3 provide a signal corresponding to whether the current (detected) state is valid and the bit-mapping for the current state on the current state output/input 688-0, ..., 688-3, and cNds[X] sub-components 668-0, ..., 668-3 provide a signal corresponding to whether the right adjacent state is valid and the bit-mapping for the right adjacent on the right adjacent state output/input 690-0, ..., 690-3. FIG. 6 also shows cNds[X] sub-components 668-0, ..., 668-3 providing a signal corresponding to whether the current of right adjacent state belong to the second shell on 692-0, ..., 692-3.

The cLLR1D[X] sub-components 670-0, ..., 670-3 can receive the signals described above on the various inputs described above as describing the PMF for each dimension and output soft data, e.g., LLR, at an output 672-0, ..., 672-3. That is, the cLLR1D[X] sub-components 670-0, ..., 670-3 can receive signals corresponding to the probability of all the possible program states for the respective dimension along with the associated bit mapping, determine the sub-set of valid PMFs for each dimension, and compute the log likelihood ratio (LLR), such as for the one dimensional case. As previously discussed with respect to Table 11, according to a number of embodiments, the cLLR1D[X] sub-components 670-0, ..., 670-3 can receive signals corresponding to the logarithm of the probability of all the possible program states for the respective dimension to enable more efficient processing of computations in the log domain. For the highest dimension, e.g., 3 in FIG. 6, additional soft data, e.g., LLR, can be computed corresponding to the probability of the stored state being in the second shell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a controller to:
determine states of memory cells of a group of memory cells operated as fractional digit memory cells; and
determine soft data based, at least partially, on:
dimensions to which particular memory cells correspond with respect to the group of memory cells,
determined states of the memory cells with respect to a state adjacent a state corresponding to a swapping shell, and
whether a particular memory cell is a candidate for swapping,
wherein the particular memory cell is one of a group of G memory cells programmed such that a combination of respective program states of the G memory cells maps to a constellation point corresponding to an N digit data value, the group of G memory cells used to store N/G digits of data per memory cell.

2. The apparatus of claim 1, wherein the controller determines soft data based, at least partially, on determined states of the memory cells with respect to a second highest state.

3. The apparatus of claim 1, wherein the controller determines soft data based, at least partially, on whether the particular memory cell is a candidate for swapping within a polynomial-based mapping between states and digits of data values.

4. The apparatus of claim 1, wherein the controller determines states of memory cells of the group of memory cells via a hard read, the hard read determining a sign of the soft data.

5. The apparatus of claim 1, wherein the controller determines soft data independently of the other memory cells of the group of memory cells for a memory cell corresponding to a dimension that is not a candidate for swapping.

6. The apparatus of claim 5, wherein the memory cell is not a candidate for swapping if the determined state of the memory cell is less than the second highest state.

7. The apparatus of claim 5, wherein a memory cell corresponding to a highest dimension and a memory cell corresponding to another dimension are candidates for swapping if the memory cell corresponding to the another dimension has a determined state greater than or equal to the second highest state.

8. The apparatus of claim 1, wherein the controller determines soft data via determining confidence values corresponding to a particular digit of the N digit data value.

9. The apparatus of claim 8, wherein the controller determines confidence values corresponding to the particular digit of the data value by computing a log-likelihood ratio (LLR) corresponding to the particular digit of the N-digit data value.

10. The apparatus of claim 8, wherein the constellation point is one of a number of constellation points of a constellation associated with mapping respective program state combinations of the group of memory cells to N digit data values; and
wherein the constellation comprises a non-swapping shell and a swapping shell, the constellation points corresponding to the respective non-swapping and swapping mapping shells determined, at least partially, based on a polynomial expression of order equal to G.

11. The apparatus of claim 1, wherein the controller is an internal controller communicatively coupled to the array of memory cells.

12. The apparatus of claim 1, wherein the controller is an external controller communicatively coupled to a memory device, the memory device including the array of memory cells.

13. A method, comprising:
determining, via a controller, states of memory cells of a group of memory cells operated as fractional digit memory cells; and
determining, via the controller, soft data based, at least partially, on:
dimensions to which particular memory cells correspond with respect to the group of memory cells,
determined states of the memory cells with respect to a state adjacent a state that indicates a swapping shell configuration, and
whether a particular memory cell is a candidate for swapping,
wherein for a memory cell having a dimension that is not a candidate for swapping, determining soft data is based on the determined state of memory cell without consideration of the determined state of other memory of the group of memory cells, and
wherein determining soft data for a memory cell includes determining soft data based, at least partially, on determined states of the memory cells with respect to a state adjacent a state indicating a swapping shell correspondence configuration between memory cells and positions of digits of a data value represented by the determined state to which the respective memory cells are programmed.

14. The method of claim 13, wherein determining soft data for a memory cell that is a candidate for swapping, determining soft data is based, at least partially, on a determined state of another memory cell of the group of memory cells.

15. The method of claim 14, wherein the determined state of another memory cell of the group of memory cells is a highest dimensions of a mapping scheme.

16. The method of claim 13, wherein determining the states of the memory cells includes determining the states of the memory cells via a hard read of the memory cells, the hard read determining a sign of the soft data.

17. The method of claim 13, wherein determining soft data includes determining soft data based, at least partially, on whether the particular memory cell is a candidate for swapping within a polynomial-based mapping between states and digits of data values.

18. The method of claim 13, wherein for a memory cell corresponding to a highest dimension, determining soft data includes determining soft data based, at least partially, on a probability of the determined state of the memory cell corresponding to a highest dimension, a probability of each adjacent state to the determined state of the memory cell corresponding to a highest dimension, and a probability of determined and adjacent states of a memory cell that is a candidate for swapping with the memory cell having a dimension corresponding to the highest dimension.

19. The method of claim 13, wherein for a memory cell that is a candidate for swapping and not corresponding to a highest dimension, determining soft data includes determining soft data based, at least partially, on a probability of the determined state of the memory cell corresponding to a highest dimension and a probability of each adjacent state to the determined state of the memory cell corresponding to a highest dimension.

20. A method, comprising:
- determining, via a controller, states of memory cells of a group of memory cells operated as fractional digit memory cells; and
- determining, via the controller, soft data based, at least partially, on:
  - dimensions to which particular memory cells correspond with respect to the group of memory cells,
  - determined states of the memory cells with respect to a state adjacent a state that indicates a swapping shell configuration, and
- whether a particular memory cell is a candidate for swapping,
  - wherein for a memory cell corresponding to a highest dimension, determining soft data includes determining soft data based, at least partially, on a probability of the determined state of the memory cell corresponding to a highest dimension, a probability of each adjacent state to the determined state of the memory cell corresponding to a highest dimension, and a probability of determined and adjacent states of a memory cell that is a candidate for swapping with the memory cell having a dimension corresponding to the highest dimension.

21. A method, comprising:
- determining, via a controller, states of memory cells of a group of memory cells operated as fractional digit memory cells; and
- determining, via the controller, soft data based, at least partially, on:
  - dimensions to which particular memory cells correspond with respect to the group of memory cells,
  - determined states of the memory cells with respect to a state adjacent a state that indicates a swapping shell configuration, and
- whether a particular memory cell is a candidate for swapping,
  - wherein for a memory cell that is a candidate for swapping and not corresponding to a highest dimension, determining soft data includes determining soft data based, at least partially, on a probability of the determined state of the memory cell corresponding to a highest dimension and a probability of each adjacent state to the determined state of the memory cell corresponding to a highest dimension.

* * * * *